United States Patent
Godet et al.

(10) Patent No.: US 9,240,350 B2
(45) Date of Patent: Jan. 19, 2016

(54) TECHNIQUES FOR FORMING 3D STRUCTURES

(75) Inventors: Ludovic Godet, Boston, MA (US); Christopher R. Hatem, Hampton, NH (US); George D. Papasouliotis, North Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 16 days.

(21) Appl. No.: 13/472,329

(22) Filed: May 15, 2012

(65) Prior Publication Data

US 2012/0295444 A1 Nov. 22, 2012

(51) Int. Cl.
| | |
|---|---|
| C03C 15/00 | (2006.01) |
| C03C 25/68 | (2006.01) |
| C23F 1/00 | (2006.01) |
| H01L 21/8234 | (2006.01) |
| H01L 21/768 | (2006.01) |
| H01L 21/02 | (2006.01) |
| H01L 21/311 | (2006.01) |
| H01L 21/3115 | (2006.01) |
| H01L 21/84 | (2006.01) |

(52) U.S. Cl.
CPC .. H01L 21/823431 (2013.01); H01L 21/02321 (2013.01); H01L 21/31111 (2013.01); H01L 21/31116 (2013.01); H01L 21/31155 (2013.01); H01L 21/76802 (2013.01); *H01L 21/76829* (2013.01); *H01L 21/76834* (2013.01); *H01L 21/845* (2013.01)

(58) Field of Classification Search
None
See application file for complete search history.

(56) References Cited

U.S. PATENT DOCUMENTS

| | | | |
|---|---|---|---|
| 5,961,877 A | 10/1999 | Robinson et al. | |
| 6,141,103 A * | 10/2000 | Pinaton et al. | 356/369 |
| 6,642,090 B1 * | 11/2003 | Fried et al. | 438/164 |
| 2005/0199920 A1 | 9/2005 | Lee et al. | |
| 2007/0057325 A1* | 3/2007 | Hsu et al. | 257/347 |
| 2007/0257296 A1* | 11/2007 | Miyano | 257/311 |
| 2008/0001187 A1 | 1/2008 | Booth et al. | |
| 2009/0057780 A1 | 3/2009 | Wong et al. | |
| 2009/0111257 A1 | 4/2009 | Hsu et al. | |
| 2010/0025771 A1* | 2/2010 | Hoentschel et al. | 257/369 |

FOREIGN PATENT DOCUMENTS

| | | | | |
|---|---|---|---|---|
| GB | 2336715 A | | 10/1999 | |
| JP | 2004063892 A | | 2/2004 | |
| KR | 10-2011-0010383 | * | 2/2011 | H01L 21/336 |
| KR | 20110010383 A | | 2/2011 | |
| KR | 20110042789 A | | 4/2011 | |

* cited by examiner

*Primary Examiner* — Stephanie Duclair

(57) ABSTRACT

A technique for forming 3D structures is disclosed. In one particular exemplary embodiment, the technique may be realized as a method for forming 3D structures. The method may comprise providing a substrate comprising at least two vertically extending fins that are spaced apart from one another to define a trench; depositing a dielectric material in the trench between the at least two vertically extending fins; providing an etch stop layer within the dielectric material, the etch stop layer having a first side and a second opposite side; removing the dielectric material near the first side of the etch stop layer.

11 Claims, 5 Drawing Sheets

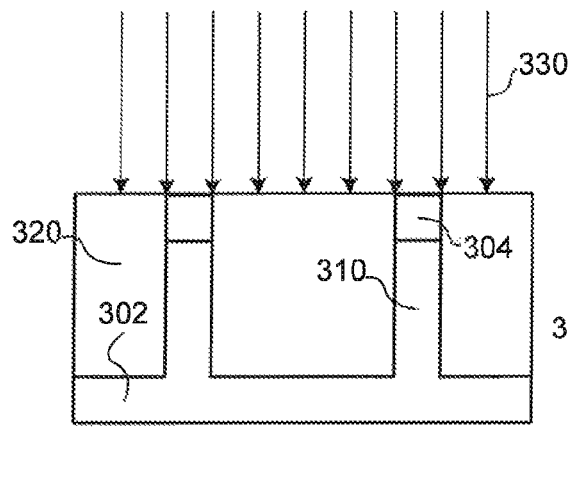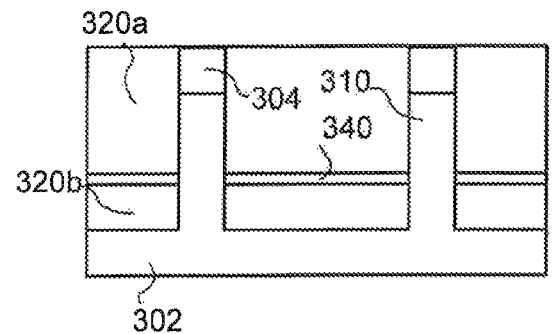
FIG. 3f          FIG. 3g
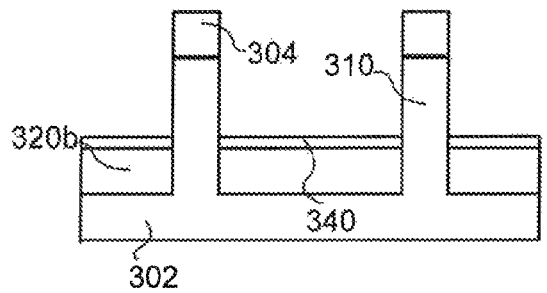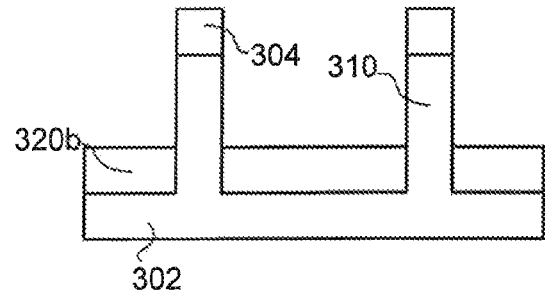
FIG. 3h          FIG. 3i
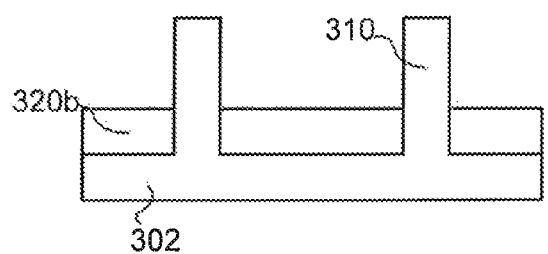
FIG. 3j

TECHNIQUES FOR FORMING 3D STRUCTURES

PRIORITY

This application is a non-provisional application of and claims priority to U.S. Provisional Application Ser. No. 61/486,511, filed on May 16, 2011 and entitled "TECHNIQUES FOR FORMING 3D STRUCTURE." The entire U.S. Provisional Application Ser. No. 61/486,511 is incorporated herein by reference.

FIELD

The present disclosure relates to a method processing a substrate, more particularly for a method for processing a substrate with 3D structures.

BACKGROUND

In response to an increased need for smaller electronic devices with denser circuits, devices with three dimensional (3D) structures have been developed. An example of such devices includes FinFETs having conductive fin-like structures that are raised vertically above the horizontally extending substrate. Referring to FIG. 1a, there is shown a perspective view of a conventional FinFET 100 formed on a substrate 102. The substrate 102 may comprise, for example, a semiconducting substrate, or silicon-on-insulator. In one example, the substrate 102 may comprise a semiconducting substrate 102a and an oxide layer 102b disposed on the semiconducting substrate 102a. FinFET 100 may also comprise a source region 112 and drain region 114 that are connected to one another by a fin structure 116 serving as the channels. For convenience, FIG. 1a shows FinFET device 100 with only two fin structures 116. However, those of ordinary skill in the art will recognize that other FinFET devices may contain a single fin structure, or three or more fin structures. The conventional FinFET device 100 may also include a gate structure 122 formed across the fin structures 116, and a gate dielectric 124 that electrically isolates the gate structure 122 from the fin structure 116. In the conventional FinFET device 100, the surface area of the fin structure 116 in contact with gate dielectric 124 may be the effective channel region. Referring to FIG. 1b, there is shown a cross sectional view of the FinFET 100 shown in FIG. 1a. For convenience, the source region 112 and the drain region 114 are omitted from the figure. As illustrated, the fin structures 116 may extend vertically from the substrate 102. In another example, the fin structures may be disposed above the oxide layer so that it is electrically isolated from the semiconducting substrate.

Referring to FIG. 2a-2f, there is shown a conventional method for manufacturing FinFET device 100 having fin structures 116 shown in FIG. 1. As illustrated in FIG. 2a, a substrate 202 such as a silicon wafer may be provided. On the substrate 202, a layer of hardmask 204 is formed (FIG. 2b). Thereafter, a layer of photoresist may be deposited onto the hardmask 204. After depositing the resist, the photoresist may be patterned. As known in the art, various methods including photolithography may be used to pattern the photoresist 206. Thereafter, the pattern of the resist 206 may be transferred onto the hardmask 204 and a portion of the substrate 202 via an etching process. The resulting structure may include the patterned hardmask 204 and fin structure 210 corresponding to the pattern of the photoresist 206, as illustrated in FIG. 2c. Those skilled in the art will recognize that the fins structures 210 formed in this process may be the fin structure 116 shown in FIGS. 1a and 1b. An oxide layer 220, such as $SiO_2$, may be deposited on the substrate, as shown in FIG. 2d. Thereafter, a chemical-mechanical polishing/planarization (CMP) process may be performed to planarize the resulting structure (FIG. 2e). As illustrated in FIG. 2e, the CMP process may be performed until either the patterned hardmask 204 or the fin structure 210 is exposed. After the CMP process, a wet or dry etching process may performed to remove a portion of the oxide layer 210 until the sidewalls of the fin structures 210 are exposed (FIG. 2f). The structure that may be formed after the etching process may include a substrate 202, the oxide layer 220, and one or more fin structures 210 extending above the oxide layer 220.

The above process, although adequate, contains several shortcomings. One of such shortcomings may found in the uniformity of oxide layer 220 and the fin structures 210. In particular, the etching process used to expose the fin structures 210 may be a non-uniform process with non-uniform etch rate across the substrate 202. The oxide layer 220 in one part of the substrate 202 may be etched at a greater rate compared to the other parts of the substrate 202. Accordingly, the oxide layer 220, with varying thickness, may form.

In addition, the fin structures 210 in one part of the substrate 202 may be exposed before fin structures 210 in other parts of the substrate 202. Moreover, the fin structures 210 exposed earlier part of the etch process may be exposed to etchants for longer period of time. Ultimately, the fin structures 210 with non-uniform widths and heights may form across the substrate 202. Other processes including CMP process may also contribute to a non-uniform oxide layer 220 and fin structures 210. Moreover, the etching process used to expose the fin structures 210 is a timed etching process with a great number of variables. A slight variation in the etching process may result in reduced repeatability or increased substrate-to-substrate non-uniformity. The fin structures 210 on different substrates 202 may have different height and/or width. As the performance of the FinFET devices may be influenced by the properties of the fin structures 210, it may be desirable to form more uniform fin structures 210. As such, uniformity and repeatability of the process used to form the fin structures are highly desirable.

Further, if a wet etching process is used to expose the fin structure 210, a phenomenon such as corner rounding 211 may occur. Such a phenomenon may contribute to less than optimal performance of the FinFET devices.

Accordingly, a new method for forming the fin structure is needed.

SUMMARY

A technique for forming 3D structures is disclosed. In one particular exemplary embodiment, the technique may be realized as a method for forming 3D structures. The method may comprise providing a substrate comprising at least two vertically extending fins that are spaced apart from one another to define a trench; depositing a dielectric material in the trench between the at least two vertically extending fins; providing an etch stop layer within the dielectric material, the etch stop layer having a first side and a second opposite side; removing the dielectric material near the first side of the etch stop layer.

In accordance with other aspects of this particular exemplary embodiment, the dielectric material near the second side of the etch stop layer is not removed while the dielectric material near the first side of the etch stop layer is removed.

In accordance with further aspects of this particular exemplary embodiment, the method further comprises exposing a portion of the at least two vertically extending fins.

In accordance with additional aspects of this particular exemplary embodiment, the providing the etch stop layer comprises implanting etch stop layer forming particles into the dielectric material.

In accordance with further aspects of this particular exemplary embodiment, the species of the particles comprises at least one of Si and Ge.

In accordance with additional aspects of this particular exemplary embodiment, the species of the particles comprises at least one of N and C.

In accordance with further aspects of this particular exemplary embodiment, the species of the particles comprises at least one of H, He, Ne, Ar, Kr, and Xe.

In accordance with additional aspects of this particular exemplary embodiment, the providing the etch stop layer further comprises annealing the substrate.

In accordance with other aspects of this particular exemplary embodiment, the etch stop layer extends horizontally.

In accordance with additional aspects of this particular exemplary embodiment, the etch stop layer extends vertically.

In accordance with another exemplary embodiment, the technique may be realized as a method for forming FinFET structure, where the method comprises providing an etch stop layer within a dielectric layer deposited on the substrate, the substrate comprising at least one vertically extending fin.

In accordance with other aspects of this particular exemplary embodiment, the providing an etch stop layer comprises implanting ions into the dielectric layer.

In accordance with further aspects of this particular exemplary embodiment, the ions comprise at least one of Si containing ions and Ge containing ions.

In accordance with additional aspects of this particular exemplary embodiment, the ions comprise at least one of N containing ions and C containing ions.

In accordance with further aspects of this particular exemplary embodiment, the ions comprises at least one of H containing ions, He containing ions, Me containing ions, Ar containing ions, Kr containing ions, and Xe containing ions.

In accordance with additional aspects of this particular exemplary embodiment, the providing the etch stop layer further comprises annealing the substrate after implanting ions into the dielectric material.

In accordance with further aspects of this particular exemplary embodiment, the ions are implanted at a temperature ranging between about 25° C. to about 750° C.

In accordance with additional aspects of this particular exemplary embodiment, the etch stop layer has a first side and a second opposite side.

In accordance with other aspects of this particular exemplary embodiment, the method further comprises removing the dielectric material disposed on the first side of the etch stop layer without removing the dielectric material disposed on the second side of the etch stop layer.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 3A-3j illustrate an exemplary method for forming 3D structure in accordance with one embodiment of the present disclosure.

DETAILED DESCRIPTION

Herein a novel technique for forming a 3D structure is disclosed. The structure may have one or more protrusions or trenches that extend in vertical direction relative to the substrate. The substrate, herein, may be metallic, semiconducting, or insulating substrate, or a combination thereof. For purpose of clarity, the embodiments are introduced in context of "particles." The particles may be charged or neutral, subatomic, atomic, or molecular particles that process the substrate.

Figure 1A:
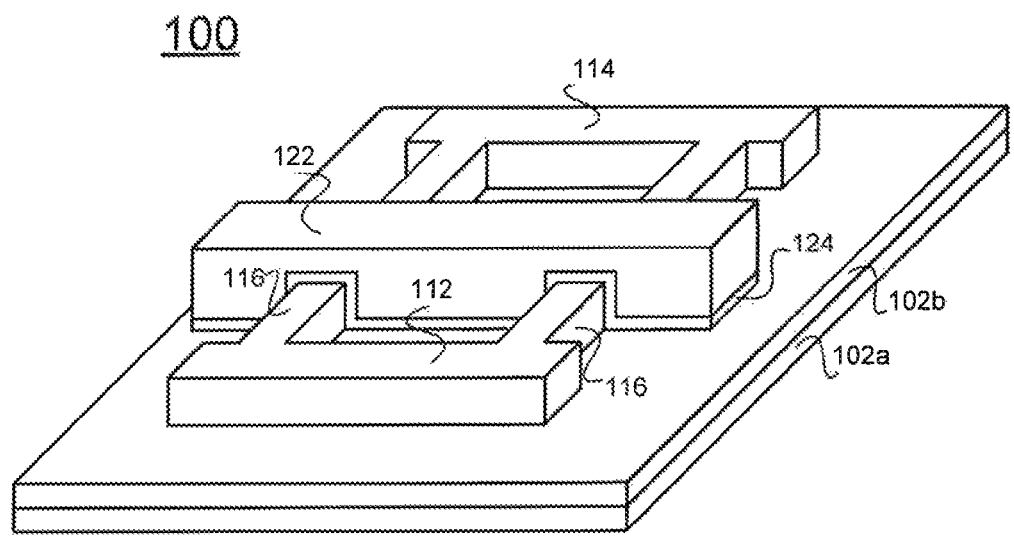
FIGS. 1a and 1b illustrates a conventional 3D structure.
Figure 1B:
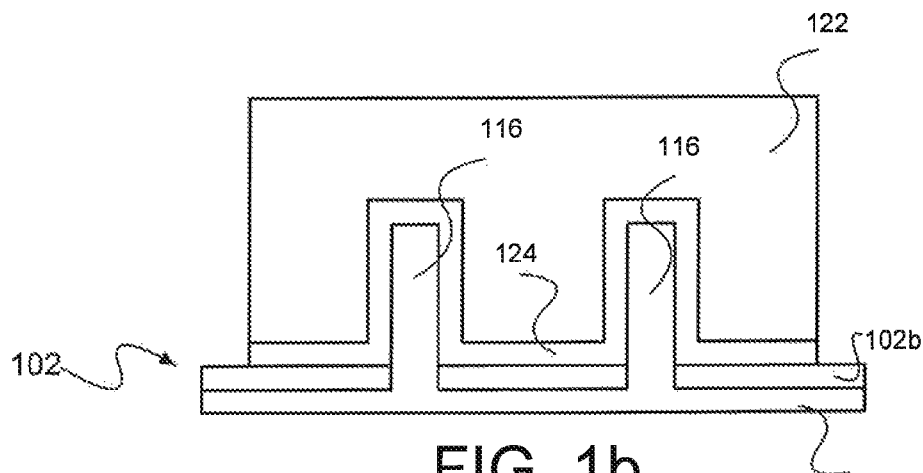
Figure 2A:
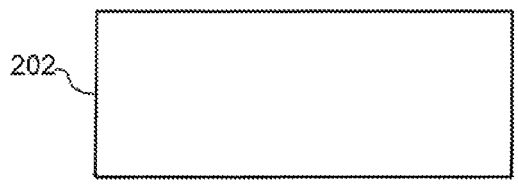
FIG. 2a-2f illustrate a conventional method for forming conventional 3D structure.
Figure 2B:
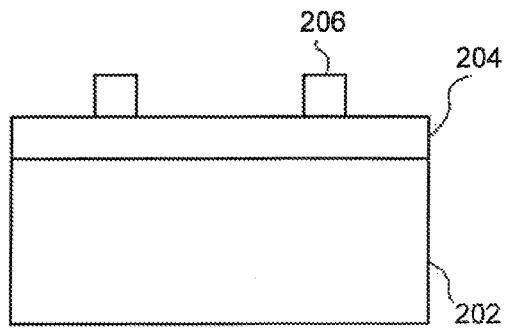
Figure 2C:
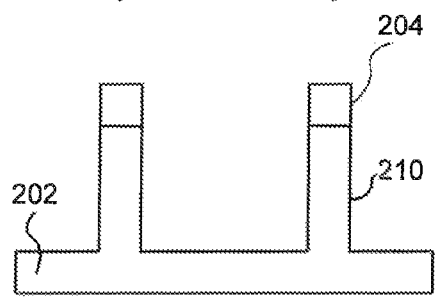
Figure 2D:
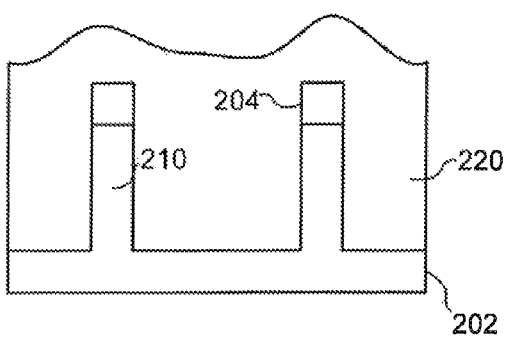
Figure 2E:
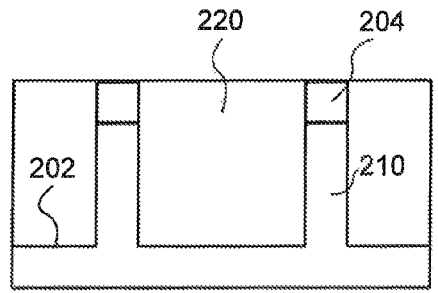
Figure 2F:
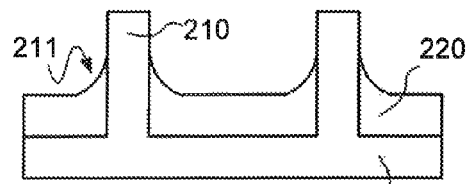
Figure 3A:
Figure 3B:
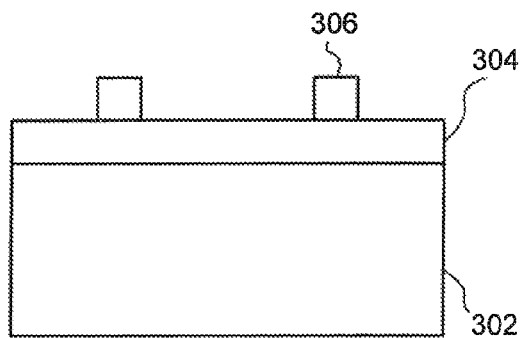
Figure 3C:
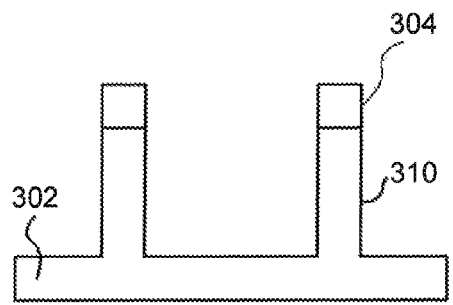
Figure 3D:
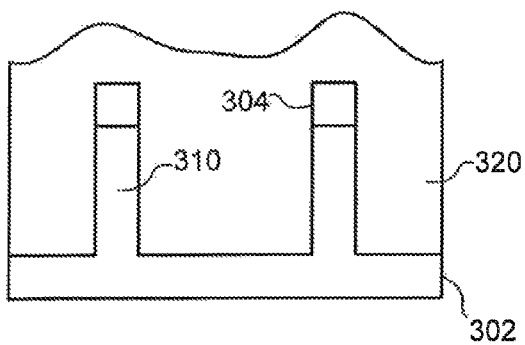
Figure 3E:
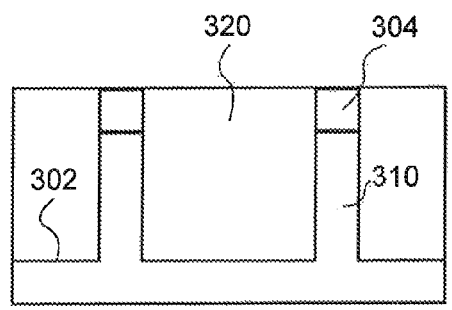

Referring to FIG. 3a-3i, there is shown an exemplary technique for forming a 3D structure according to one embodiment of the present disclosure. Initially, a substrate 302 is provided as illustrated in FIG. 3a. On the substrate 302, a layer of hardmask 304 is deposited as shown in FIG. 3b. Thereafter, a layer of resist 306, for example, a photoresist, may be deposited onto the hardmask 304 and patterned via various patterning processes. Examples of the patterning process may include photolithography, EUV lithography, double patterning lithography, and nano-imprint lithography. The pattern formed on the resist 306 may be transferred onto the hardmask 304 and/or the substrate 302 via, for example, an etching process. The resulting structure may include fin structures 310 corresponding to the pattern of the patterned resist 306 as shown in FIG. 3c. In the present embodiment, the hardmask 304 may remain on the fin structures 310. In another embodiment, the hardmask 304 may be removed during the pattern transferring process. Thereafter, an insulating material may be deposited to form an insulating layer 320 (as shown in FIG. 3d). In the present disclosure, various insulating materials may deposited. Examples of the insulating materials may include $SiO_2$ and SiN. In some embodiments, different insulating materials may be deposited. For example, SiN may be deposited first, and $SiO_2$ may be deposited on top of the SiN, or vice versa. Those of ordinary skill in the art will recognize that the present disclosure does not preclude a scenario where other insulating materials are deposited on the substrate 302. After the insulating layer 320 is formed, the CMP process may be performed to planarize the resulting structure as illustrated in FIG. 3e.

After the CMP process, etch stop layer 340 may be provided within the oxide layer 320 at a desired depth as shown in FIG. 3g. In the present embodiment, the etch stop layer 340 is provided after the CMP process. However, the present disclosure does not preclude provision of the etch stop layer 340 prior to the CMP process. In some embodiments, the etch stop layer 340 may be provided during formation of the insulating layer 320.

Various processes may be used to provide the etch stop layer 340. In one embodiment, the etch stop layer 340 shown in FIG. 3g may be provided via a deposition process. In the present embodiment, the etch stop layer 340 may be provided by introducing etch stop layer forming particles 330 in the form of ions. In another embodiment, the particles 330 in another form may be introduced using other processes.

In the present disclosure, particles 330 may contain various species. The preferred species may be silicon (Si). Silicon is preferred as the species may form a buried Si rich etch stop layer 340 when provided into the insulating layer 320. However, those of ordinary skill in the art will recognize that in other embodiments, other species, including metallic and other non-metallic species, may be used. Examples of other species may include nitrogen (N) to form SiN rich etch stop layer 340. In another example, carbon (C) particles 330 may be implanted to form SiC rich etch stop layer 340. Yet in other embodiments, other species including boron (B), aluminum (Al), gallium (Ga), indium (In), germanium (Ge), tin (Sn), phosphorous (P), arsenic (As). Moreover, the species of the particles 330 chosen may include the species found in the fin structure 310. Such species may include, among others, Si and Ge. Further, other types of particles, including sub-atomic particles (e.g. protons or electrons) may also be implanted. When provided, one or more species may be provided at uniform rate such that the dose of the particles 330 introduced across the dielectric layer 320 may be uniform, or at varying rate such that doses of the particles 330 in different portions of the dielectric layer differ.

In the present disclosure, a single species may be introduced into the insulating layer 320. Alternatively, two or more species may be co-implanted. For example, particles 330 of C or N species may be implanted together, or with additional particles 330 of Si species. Alternatively, all three species may be implanted. Moreover, other species including hydrogen (H), helium (He), neon (Ne), argon (Ar), krypton (Kr), xenon (Xe), and other inert species, or a combination thereof, may be co-implanted with Si, C, and/or N. In the present embodiment, the implantation process may preferably be performed so as to minimize or reduce possible amorphization or damage to the fin structures 310. For example, the implantation process may be performed while the fin structures 310 are maintained at an elevated temperature ranging between about 25° C. to about 750° C. so as to minimize amorphization or damage to the fin structure 310.

Optionally, the substrate 302 may be annealed to enhance formation of the etch stop layer 340, as shown in FIG. 3g. In the present embodiment, the implanted particles 330 having a Gaussian implant depth profile may change into a box-like implant depth profile during the annealing process via thermal diffusion. As a result, concrete etch stop layer 340 with substantially uniform depth may form.

After providing the etch stop layer 340, the resulting structure may comprise, among others, the substrate 302 having the fin structures 310, an upper and lower insulating layers 320a and 320b spaced apart by the etch stop layer 340. Although the figure shows only the etch stop layer 340 extending along the horizontal direction, the etch stop layer 340, in other embodiments, may extend along the vertical direction, proximate to the vertically extending surface of the fin structures 310. For example, the particles 330 may also be implanted into the insulating layer 320 at one or more angles deviating from the angle normal to the horizontally extending surface of the substrate 302 ("zero angle"). The particles 330 implanted at a non-zero angle may form the vertically extending etch stop layer near the sidewall of the fin structures 310.

In addition to the orientation, other properties of the etch stop layer 340 may be adjusted. For example, the thickness of the etch stop layer 340 may be adjusted by controlling the dose and the energy of the particles 330 and/or the duration in which the particles 330 are exposed to elevated temperature. Further, the depth of the etch stop layer 340 may also be adjusted by adjusting the energy by which the particles 330 are implanted, the material of the insulating layer 310, and/or species of the particles 330 implanted. For example, the density of the $SiO_2$ (~1.8) may be greater than that of SiN (~3.44). By depositing insulating materials with higher density and/or implanting lighter particles 330, an etch stop layer 340 with a shallower depth may be achieved. Accordingly, by controlling the parameters of the implant and annealing process, and/or the type of insulating material and the particles species, an etch stop layer 340 with desired properties may be achieved.

After forming the etch stop layer 340, the upper insulating layer 320a may be removed via a dry or wet etching process (FIG. 3h). Unlike the conventional process, the upper insulating layer 320a may be removed more uniformly even if a non-uniform etching process is used. In particular, the etching process may continue until the etch stop layer 340 is exposed and until the upper insulating layer 320a is removed uniformly. The wet or drying etching process may be followed by the ion assisted selective etching process to remove the now exposed etch stop layer 340 (FIG. 3i). In the present embodiment, the ion assisted selective etching process may be performed. In this process, the etch stop layer 340 may be removed with minimal removal of the fin structures 310 or the lower insulating layer 320b. During or after removing the etch stop layer 340, the hard mask 304 may be removed from the fin structures 310 (FIG. 3j). As illustrated in FIG. 3j, more uniform fin structures 310, and insulating layer 320b with more uniform thickness may form across the substrate 302. In addition, higher substrate-to-substrate uniformity may be achieved.

Figure 4A:
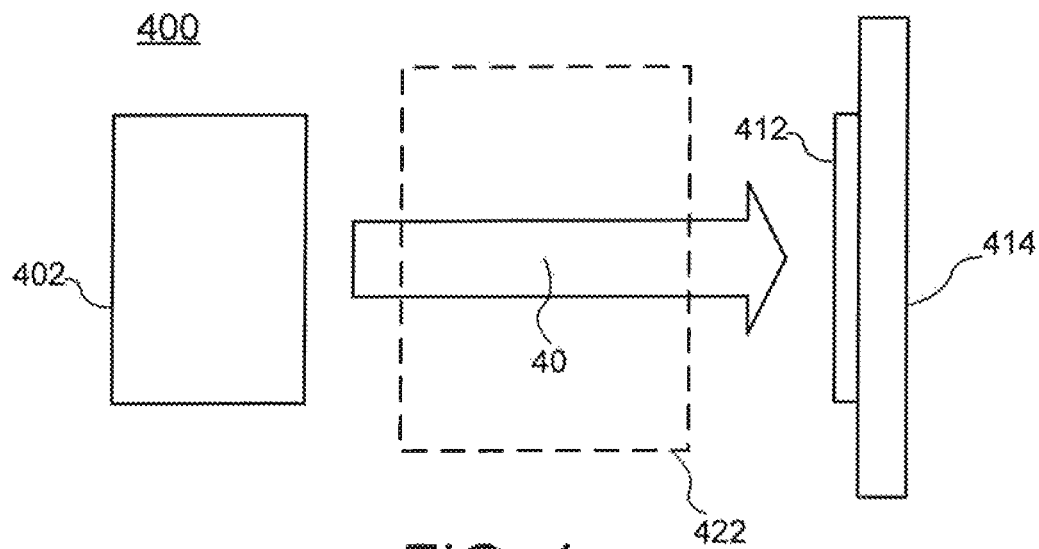
FIG. 4 illustrates an exemplary system for forming 3D structure in accordance with one embodiment of the present disclosure.

Herein, several exemplary systems for forming the etch stop layer 340 are provided. Referring to FIG. 4, there is shown a simplified figure of an exemplary system 400 according to one embodiment of the present disclosure. The figure is not drawn to scale. In this figure, a particle implantation system 400 for implanting particles 322 into the insulating layer 320 is shown. The particle implantation system 400 may comprise a particle source 402 for generating desired particles 40. The generated particles 40 may be emitted from the particle source 402 and travel along one or more paths toward a substrate 412 disposed downstream. The substrate 412 may be supported on a platen 414, which may or may not provide DC or RF bias to the substrate 412. The substrate 412 and the platen 414 may be moved in one or more directions and/or dimensions (e.g., translate, rotate, tilt, and combination thereof) relative to the particles 40 incident on the substrate 412.

Optionally, the ion implantation system 400 may include a series of complex beam-line components 422 through which the particles 40 may pass. If included, the series of beam-line components 422 may include at least one of a mass analyzer (not shown), a first acceleration or deceleration stage (not shown), a collimator (not shown), and a second acceleration or deceleration stage (not shown). Much like a series of optical lenses that manipulate a light beam, the beam-line components 422 can shape, filter, focus, and manipulate the particles 40. For example, the second acceleration or deceleration stage of the beam line components 422 can vary the energy of the particles 40, and the substrate 412 may be implanted with particles 40 at one or multiple energies. In addition, the beam-line components may shape the particles 40 into a spot or ribbon shaped particle beam 40 having one or more desired energies.

Further, the beam-line components may scan the particle beam 40 in one or more directions and/or dimensions relative to the substrate 412. The scanning of the particle beam 40 may occur in conjunction with the movement of the substrate 412. Accordingly, either the particle beam 40 may move in one or more directions/dimensions relative to a stationary substrate 412, or vice versa. Or, both the particle beam 40 and the substrate 412 may move in one or more directions/dimensions relative to one another at the same time. In the present disclosure, the particle beam 40 and/or the substrate 412 may move at a constant or varied rate. By moving the particle beam 40 and/or the substrate 412 relative to one another at a constant rate, particles 322 may be implanted with uniform dose. If, however, the particle beam 40 and/or the substrate 412 move relative to one another at a varied rate, particles 322 may be implanted with nonuniform doses. Implanting particles with non-uniform dose rates across the substrate 412 may compensate one or more non-uniform processes subsequent to the implantation process. For example, if the annealing process is performed after the implantation process, and if the annealing process is less than optimally uniform across the substrate, a non-uniform particle implantation process may be performed in order to compensate the non-uniformity in the annealing process. The non-uniform implantation may include implantation with varied energy or dosage across the substrate. In one embodiment, the particles may be an implantation at different dose rates from the center to the edge of the substrate. After the annealing process, the particles may be activated at a more uniform rate.

Figure 5:
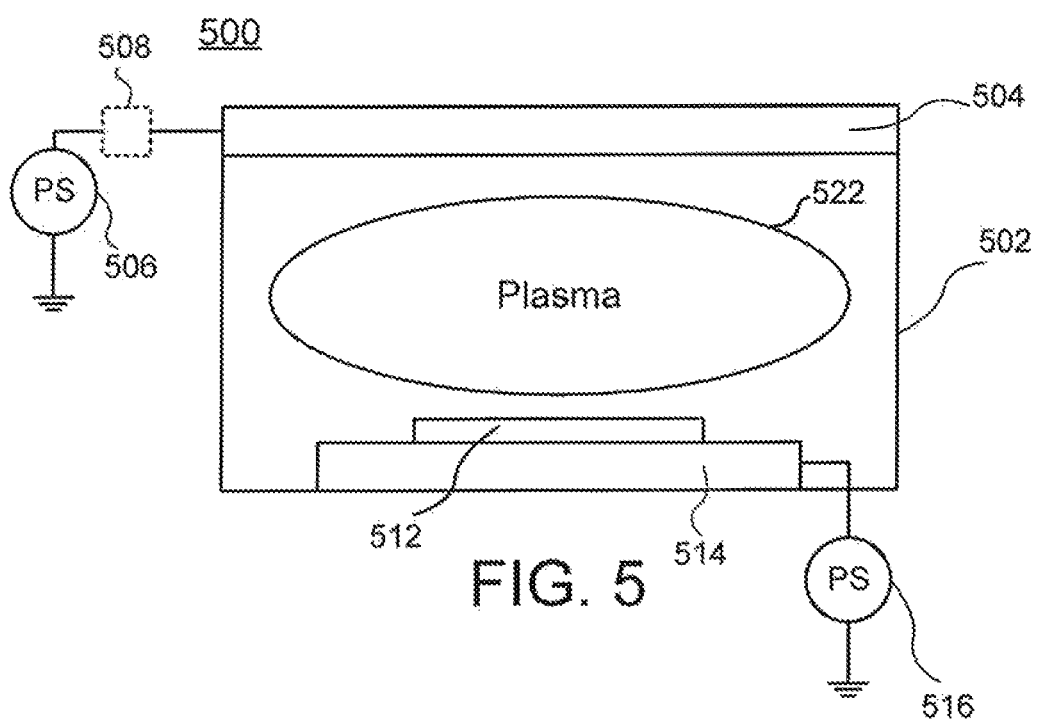
FIG. 5 illustrates another exemplary system for forming 3D structure in accordance with another embodiment of the present disclosure.

Referring to FIG. 5, there is shown a simplified figure of another exemplary system 500 according to one embodiment of the present disclosure. The figure is not drawn to scale. In this figure, a plasma based particle implantation system 500 for implanting particles 322 into the insulating layer 320 is shown. The particle implantation system 500 may comprise a chamber in which a substrate 512 is disposed. The substrate 512 is disposed on a platen 514, which is electrically coupled to a first power supply 516. The first power supply 516 may provide to the platen 514 and the substrate 512 continuous or pulsed, positive or negative, RF or DC bias.

The system 500 may also comprise a plasma source 504 proximate to the chamber 502, inside or outside of the chamber 502. Although only one plasma source 504 is shown, the present disclosure does not preclude the system 500 with multiple plasma sources. In some embodiments, the plasma source 504 may be a remote plasma source that is spatially removed from the chamber 502. The plasma source 504 may be an inductively coupled plasma source. However, those of ordinary skill in the art will recognize that in the present disclosure, the plasma source 504 is not limited to a particular plasma source. For example, the plasma source 504 may be a capacitively coupled plasma source, helicon plasma source, or microwave plasma source. As illustrated in the figure, the plasma source 504 is electrically coupled to and powered by a second power supply 506. The second power supply 506 may provide continuous or pulsed, RF or DC power. In some embodiments, the platen 514 and/or the substrate 512 powered by the first power supply 516 may act as the plasma source.

In operation, one or more gases/vapors containing desired species may be contained in the chamber 502. Thereafter, the plasma source 504 may be powered to convert the gases/vapors into plasma 522 containing, among others, ions, electrons, neutrals, and other radicals of desired species. In the present embodiment, the power applied to the plasma source 504 may be constant or varied. A detailed description of the plasma source being applied with varied RF or DC power may be found in U.S. patent application Ser. No. 12/105,761, which is incorporated in its entirety by reference.

As illustrated in the figure, the plasma 522 may be generated near the substrate 512. While the plasma is near the substrate 512, the first power supply 516 may provide continuous or pulsed, positive or negative, RF or DC bias to the substrate 512. The ions in the plasma 522 may be attracted and implanted into the substrate 512 in response to the provided bias. In the present embodiment, a pulsed, DC bias with uniform bias level may be provided to the substrate 512. Alternatively, the bias provided to the substrate 512 may be a pulsed DC bias; but the bias level may ramp upward or downward at a constant or varied rate. A detailed description of the bias ramping is provided in U.S. Pat. No. 7,528,389, which is incorporated in its entirety by reference.

Herein, several process parameters of the process for implanting particles to form the etch stop layer 340 are provided. As noted above, one of the process parameters that may be controlled during the implantation process may be the dose rate. For example, the rate by which the particles 322 are implanted may range from about $1 \times 10^{15}$ to about $5 \times 10^{15}$. A dose rate of about $1 \times 10^{15}$ may result in an etch stop layer of about 2 nm thickness. Meanwhile, a does rate of about $5 \times 10^{15}$ may result in an etch stop layer of about 10 nm thickness. By controlling, among others, the dose rate, the etch stop layer 340 with desired thickness may be achieved.

In addition to the dose rate, the movements of the particle beam 40 and/or the substrate 412 (e.g. scan rate) may be controlled to provide uniform or non-uniform particle implantation. As noted above, either the particle beam 40 the substrate 412, or both, may move (e.g. scan) relative to one another at a non-uniform rate to induce non-uniform particle implantation. Such a non-uniform implantation may be useful to compensate one or more non-uniform processes that may be performed after the implantation process. For example, the annealing process that may be performed after the implantation process may be a non-uniform process. Accordingly, the rate by which the particle beam 40 or the substrate 412, or both, may move (e.g. scan) relative to one another may be varied across the substrate 412. For example, the rate may be varied from the center of the substrate 412 to the edge of the substrate 412. Such a non-uniform movements may induce a more uniform etch stop layer 340 after the annealing process.

If a plasma based particle implantation system 500 is used, the bias provided to the substrate 512 may be varied. For example, the bias provided from the first power supply 516 may ramp up or down at a constant rate or varied rates (e.g. in steps). Such a variation may enhance the box-like profile of the etch stop layer 340 formed on the substrate 302.

Although only a limited number of the process parameters are discussed, those of ordinary skill in the art will recognize that other parameters may also be adjusted to optimize the formation of the etch stop layer 340.

Several embodiments of techniques for forming 3D structures are disclosed. Those of the art will recognize that the present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method for forming FinFET structure, the method comprising:
   providing a substrate comprising at least two vertically extending fins that are spaced apart from one another to define a trench;
   depositing an insulating material in the trench between the at least two vertically extending fins;
   providing a buried etch stop layer within the insulating material, the buried etch stop layer having a first side and a second opposite side, wherein the buried etch stop layer extends horizontally and vertically proximate to the at least two vertically extending fins;
   removing the insulating material near the first side of the buried etch stop layer, wherein the providing the buried etch stop layer comprises implanting etch stop layer forming particles at one or more non-zero angles with respect to a horizontal surface of the buried etch stop layer into the insulating material including at least one of Si, Ge, N, C, H, He, Ne, Ar, Kr, or Xe, and wherein an upper insulating layer is defined between the first side of the buried etch stop layer and a surface of the insulating material, wherein a lower insulating layer is defined below the buried etch stop layer, wherein a thickness of the buried etch stop layer is adjusted by controlling at least one of a dosage and energy of the etch stop layer forming particles, and by controlling a duration the etch stop layer forming particles are exposed to an elevated temperature; and
   selectively etching to remove the buried etch stop layer, wherein minimal removal of the lower insulating layer takes place, and wherein the lower insulating layer has a uniform thickness across the substrate.

2. The method according to claim 1, wherein the insulating material near the second side of the buried etch stop layer is not removed while the insulating material near the first side of the etch stop layer is removed.

3. The method according to claim 2, further comprising:
   exposing a portion of the at least two vertically extending fins.

4. The method according to claim 1, wherein the providing the buried etch stop layer further comprises annealing the substrate.

5. The method according to claim 1, wherein the etch stop layer forming particles are implanted at a temperature ranging between about 25° C. to about 750° C.

6. The method according to claim 1, wherein properties of the buried etch stop layer are adjusted by controlling both dosage and energy of the etch stop layer forming particles.

7. A method of forming FinFET structure, the method comprising:
   providing a buried etch stop layer within an insulating layer deposited on the substrate, the substrate comprising at least one vertically extending fin and the buried etch stop layer extends horizontally and vertically proximate to the at least one vertically extending fin, wherein the providing the buried etch stop layer comprises implanting ions at one or more non-zero angles with respect to a horizontal surface of the buried etch stop layer into the insulating material including at least one of Si, Ge, N;-C, H, He, Ne, Ar, Kr, or Xe, and wherein an upper insulating layer is defined between the buried etch stop layer and a surface of the insulating material, wherein a lower insulating layer is defined below the buried etch stop layer, wherein a thickness of the buried etch stop layer is adjusted by controlling at least one of a dosage and energy of the etch stop layer forming particles, and by controlling a duration the etch stop layer forming particles are exposed to an elevated temperature; and
   selectively etching to remove the buried etch stop layer wherein minimal removal of the lower insulating layer takes place, and wherein the lower insulating layer has a uniform thickness across the substrate.

8. The method according to claim 7, wherein the providing the buried etch stop layer further comprises annealing the substrate after implanting ions into the insulating material.

9. The method according to claim 7, wherein the ions are implanted at a temperature ranging between about 25° C. to about 750° C.

10. The method according to claim 7, wherein the buried etch stop layer has a first side and a second opposite side.

11. The method according to claim 10, further comprising:
    removing the insulating material disposed on the first side of the buried etch stop layer without removing the insulating material disposed on the second side of the buried etch stop layer.

* * * * *